United States Patent [19]
Baeg et al.

[11] Patent Number: 5,519,713
[45] Date of Patent: May 21, 1996

[54] INTEGRATED CIRCUIT HAVING CLOCK-LINE CONTROL AND METHOD FOR TESTING SAME

[75] Inventors: SangHyeon Baeg; William A. Rogers, both of Austin, Tex.

[73] Assignee: The University of Texas System, Austin, Tex.

[21] Appl. No.: 161,057

[22] Filed: Dec. 2, 1993

[51] Int. Cl.$^6$ .................................................. G01R 31/28
[52] U.S. Cl. ...................... 371/22.1; 371/22.6; 371/22.5
[58] Field of Search .................................. 371/22.1, 22.3, 371/22.5, 22.6, 15.1

[56] References Cited

U.S. PATENT DOCUMENTS

| | | | |
|---|---|---|---|
| 5,027,355 | 6/1991 | Stoica | 371/22.1 |
| 5,077,740 | 12/1991 | Kanuma | 371/22.3 |
| 5,132,974 | 7/1992 | Rosales | 371/22.3 |
| 5,230,001 | 7/1993 | Chandra et al. | 371/27 |

OTHER PUBLICATIONS

Agrawal et al., "Design for Testability and Test Generation with Two Clocks" IEEE, 1991, pp. 112–117.

Charles H. Roth, Jr., *Fundamentals of Logic Design*, 2nd Ed., pp. 4–6 and 281–284, 1979.

T. W. Williams and N. C. Brown, *Defect Level as a Function of Fault Coverage*, IEEE Transactions on Computers, vol. C–30, No. 12, pp. 987–988, Dec., 1981.

Oscar H. Ibarra and Sartaj K. Sahni, *Polynomially Complete Fault Detection Problems*, IEEE Transactions on Computers, vol. C–24, No. 3, pp. 242–249, Mar., 1975.

Premachandran Menon, et al., *Script: A Critical Path Tracing Algorithm for Synchronous Sequential Circuits*, IEEE Transactions on Computer–Aided Design, vol. 10, No. 6, pp. 738–747, Jun., 1991.

Miron Abramovici, et al., *Freeze!: A New Approach for Testing Sequential Circuits*, 29th ACM/IEEE Design Automation Conference, pp. 22–25, 1992.

Miron Abramovici, et al., *Digital Systems Testing and Testable Design*, Computer Science Press, Chapter 6, pp. 249–253, 1990.

Miron Abramovici, et al., *Digital Systems Testing and Testable Design*, Computer Science Press, Chapter 9, pp. 358–411, 1990.

M. Abramovici, et al., *SMART AND FAST: Test Generation for VLSI Scan–Design Circuits*, IEEE Design & Test of Computers, vol. 3, No. 4, pp. 43–54, Aug., 1986.

S. Bhawmik, et al., *Pascant: A Partial Scan and Test Generation System*, Proc. Custom Integrated Circuits Conf., pp. 17.3.1–17.3.4, May, 1991.

Kwang–Ting Cheng & Vishwani D. Agrawal, *An Economical Scan Design for Sequential Logic Test Generation*, Proceedings of the 19th Symposium on Fault Tolerant Computing, pp. 28–35, 1989.

(List continued on next page.)

*Primary Examiner*—Emanuel T. Voeltz
*Assistant Examiner*—M. Kemper
*Attorney, Agent, or Firm*—Bell, Seltzer, Park & Gibson

[57] ABSTRACT

An integrated circuit includes a plurality of interconnected circuit modules having memory elements and logic elements therein. The modules collectively perform the operations of the integrated circuit. However, rather than testing the entire circuit and limiting the degree of fault coverage, individual modules can be tested on a module by module basis. To facilitate testing at the module level, the circuit includes a plurality of control cells connected to respective ones of the modules. Each of the control cells preferably includes a shift register latch for retaining a data signal corresponding to whether the respective module is to be sequentially tested or temporarily disabled. The control cells further comprise a pass-through transistor network for passing the system clock to one or more of the modules under test and for withholding the clock from the modules not under test. The method of the present invention includes steps for disabling one or more modules which are not under test and enabling those modules which are to be tested. The enabled modules are then tested sequentially, preferably using one or more outputs from the disabled modules. Testing of the integrated circuit occurs on a module by module basis until all modules are tested.

33 Claims, 5 Drawing Sheets

OTHER PUBLICATIONS

Thomas W. Williams & Kenneth P. Parker, *Design for Testability—A Survey*, Proceedings of the IEEE, pp. 98–112, 1983.

Thomas Niermann & Janak H. Patel, *HITEC: A Test Generation Package for Sequential Circuits*, Proc. European Conf. on Design Automation, pp. 214–218, 1991.

INTEGRATED CIRCUIT HAVING CLOCK-LINE CONTROL AND METHOD FOR TESTING SAME

Field of the Invention

The present invention relates to integrated circuits and methods for testing integrated circuits, and more particularly to integrated circuits which facilitate the performance of diagnostic testing, and methods for performing same.

Background of the Invention

The challenge of performing diagnostic testing of integrated circuits is becoming more formidable as advanced submicron processes for circuit fabrication are developed. As is well known to those having skill in the art, an integrated circuit typically includes large numbers of interconnected combinational logic elements (e.g., NAND/NOR gates) and memory elements (e.g., latches) for accomplishing predetermined logic operations under synchronous control by one or more clock signals.

Recent advances in the techniques for fabricating and designing integrated circuits have led to increased gate-count, higher integration densities, smaller feature size, higher speeds, higher performance and increased complexity. These advances have all been welcomed by the electronics industry, but pose a serious problem of testing the integrated circuit. In particular, it has become more difficult to determine in a cost effective way, whether an integrated circuit has been manufactured correctly and performs as simulated by the circuit's designers.

Moreover, because of the relative limitations of packaging technology vis-a-vis the state-of-the-art advances in circuit design and manufacture, only a relatively limited number of primary input and primary output pins (I/O pins) are provided for testing an integrated circuit at the packaged level. Accordingly, both the controllability (based on the number of primary inputs) and the observability (based on the number of primary outputs) of the performance of integrated circuits are limited once processing, including wire-bonding and packaging, has been completed. Moreover, in addition to being strongly dependent on the extent of a circuit's controllability and observability at the chip level and finally at the package level, quality control of an integrated circuit is also strongly dependent on the ability to generate diagnostic tests and verify the presence of faults at all internal nodes and elements of an integrated circuit in order to obtain complete fault coverage. This is true even for mature manufacturing processes since fault coverage greater than 99.6% is typically required to achieve defect levels of less than 200 defective parts per million.

Testing of integrated circuits includes steps for both test generation and test verification. Test generation includes the steps of enumerating a set of stimuli (test vectors or patterns) for a circuit which will demonstrate its correct operation. Test verification, on the other hand, is the process of proving that a set of tests are effective towards the goal of demonstrating correct operation. In reality, however, fault simulation is the best alternative to a formal methodology for performing test verification since formal proof is difficult in practice. Yet, with the substantial increase in circuit density in state-of-the-art chips, the ability to enumerate a complete set of stimuli automatically and conduct fault simulation with these stimuli has been substantially curtailed. As a result, some manufacturers are foregoing these more rigorous approaches to testing and are accepting increased risks of shipping defective products. Other manufacturers, however, have sought to adopt one of a number of structured testing techniques collectively referred to as "Design for Testability".

The development of Design for Testability techniques stems from the industry-wide recognition that difficulty in the testing of integrated circuits increases exponentially as the relative isolation of internal elements increases in response to higher levels of integration (from LSI→VLSI→ULSI) and the number of primary inputs and outputs, relative to integration level, decreases. Accordingly, one design for testability technique has included the addition of test contacts at internal portions of an integrated circuit chip. However, because of the physical aspects of chip level testing, which involves the lowering of test probes (or fingers) to the chip, test contacts have to be made relatively large compared to the size of the circuit elements. Thus, the use of test contacts at internal portions of a chip adversely affects the degree of integration and the performance of systems using such chips.

Other techniques have included providing internal test circuitry such as a chain of discrete latches (i.e., a shift register) for injecting and/or observing test data at predetermined ones of the circuit's nodes. This occurs by using the chain of latches to serially load and/or output a string of test data through one or more of the circuit's primary inputs and outputs. This design for testability technique is well-known and is commonly referred to as SCAN. The principles of SCAN are fully set forth in a book by authors M. Abramovici, M. Breuer and A. Friedman, entitled *Digital Systems Testing and Testable Design*, Computer Science Press, pp. 249–253, 358–411 (1990). In SCAN, latches (e.g., flip-flops) are used as control points and observation points. However, their use gives rise to a tradeoff between test time, area overhead, the number of I/O pins and performance. A survey of SCAN and related Design for Testability techniques is also disclosed in an article entitled *Design for Testability-A Survey*, by T. Williams and K. Parker, Proceedings of the IEEE, Vol. 71, pp. 98–112. These techniques are based on the premise that if all sequential memory elements of an integrated circuit can be controlled to a specific value during testing, and if they can also be observed, then the test generation and fault detection can be reduced to the task of performing fault detection on a strictly combinational integrated circuit. As will be understood by those skilled in the art, a separate control signal can be used to switch the circuit's memory elements from a normal mode of operation to a mode that makes them controllable and observable using combinational test generation (CTG) algorithms, which are typically substantially more efficient than sequential test generation (STG) algorithms.

It has been observed that the computer run time to do test generation and fault simulation on a circuit having only logic elements is approximately proportional to the number of logic gates to the power of 3 according to Equation 1 where T is the computer run time, N is the number of gates and K is a proportionality constant:

$$T=KN^3 \tag{1}$$

However, the relationship does not take into account the falloff in automatic test generation capability due to the complexity of an integrated circuit having both logic and memory elements. For example, a purely combinational circuit having N inputs requires $2^N$ sets of test patterns (i.e., test vectors) for complete functional testing. However, a sequential circuit having N inputs and M memory elements requires a minimum of $2^{N+M}$ sets of test patterns, but that minimum, which is significantly below the number required for complete functional testing, is rarely attainable using conventional techniques. To illustrate the complexity of performing testing on circuits having high levels of integration, a sequential circuit having 25 inputs and 50 memory elements would require a minimum test time of over a billion years to test, if the test rate was 1 μs per test pattern.

However, even the performance of combinational testing of sequential circuits can be time consuming and cost prohibitive. For example, although SCAN techniques transform sequential circuits into combinational ones during testing, test generation for large SCAN circuits can still require CPU times of 23 hours for a circuit with 48,000 gates, using an IBM 370/186. Improvements on SCAN which require CPU run times of 1.6 hours for circuits containing 75,000 gates have also been reported in an article by M. Abramovici, J. Kulikowski, P. Menon and D. Miller, entitled *SMART and FAST: Test Generation for VLSI Scan-Design Circuits*, IEEE Design and Test of Computers, Vol. 3, No. 4, pp. 43–54, August (1986).

An example of a generalized sequential circuit model, modified to use a shift register latch (SRL), is shown by FIG. 1. In particular, FIG. 1 illustrates IBM's level sensitive scan design for testability (LSSD), using the SRL's of FIG. 2. As will be understood by those skilled in the art, the terminology "level sensitive" refers to constraints on circuit excitation, logic depth (i.e., level) and the handling of clocked circuitry. Using the LSSD design for testability, a sequential circuit having a plurality of interconnected logic and memory elements can be combinationally tested (but not completely tested) using known test procedures. Notwithstanding these benefits, the LSSD design has negative attributes which include the relative complexity of the SRL's compared to simple latches and the number of additional primary inputs and outputs which are required (up to 4) at each package level.

A design for testability technique which is similar to LSSD is the SCAN/SET technique used by Sperry-Univac. This technique uses shift registers, but unlike LSSD, the shift registers are not in the data path. FIG. 3 schematically illustrates the SCAN/SET technique using a 64 bit serial shift register, which is typically on the same chip as the circuit. According to the SCAN/SET circuit of FIG. 3, a sequential circuit can be sampled at up to 64 nodes, and values at the nodes (binary 1 or 0) can be loaded into the shift register with a single clock. Once the 64 bits are loaded, a shifting process will occur and the respective node values will be scanned out through the scan-out pin. In the case of the set function, 64 binary values can be scanned into the circuit using the appropriate clocking structure required to load the binary values into the circuit's memory elements. However, unless all of the memory elements of the circuit can be scanned and set, the testing will not be reduced to a complete combinational test generation function and complete fault simulation function. Moreover, the SCAN/SET technique is costly in terms of area overhead and performance degradation.

Another technique, schematically illustrated by FIG. 4, is the Random-Access Scan (RAS) technique developed by Fujitsu. Like LSSD, this technique has the same goal of providing complete controllability and observability of all internal memory elements. Thus, testing using RAS can be reduced to that of combinational test generation and combinational fault simulation. However, RAS differs from LSSD and SCAN/SET because it does not require the use of shift registers. Instead, an addressing scheme is utilized which provides for the selection of each memory element in the circuit. The mechanism for addressing is similar to that of Random-Access memory, and hence, its name. The RAS technique allows for the observability and the controllability of all memory elements in the circuit. But, the cost in terms of additional logic is high and includes one address gate per observation node.

Partial SCAN techniques have also gained popularity as a major design for testability alternative to full SCAN design, primarily because of lower area overhead requirements and reduced sequential test complexity. As disclosed in an article by S. Bhawmik, C. Lin, K. Cheng and V. Agrawal entitled *PASCANT: A Partial Scan and Test Generation System*, Proc. Custom Integrated Circuits Conf., pp. 17.3.1–17.3.4, May (1991), the partial scan methodology attempts to reduce the complexity of sequential testing by selecting only a subset of the circuit's memory elements (e.g., flip-flops) for control and observation. The subset is selected so that a sequential test pattern generator can generate an appropriate set of test vectors in a reasonable amount of time and provide a high degree of fault coverage, although complete fault coverage is impossible.

U.S. Pat. No. 5,132,974 to Rosales, entitled *Method and Apparatus for Designing Integrated Circuits For Testability*, discloses a partial scan technique, commonly referred to as Register Transfer Scan (RTS). RTS shares the same clocking rules as full SCAN techniques, but includes two additional features. The first feature is that feedback paths in the circuit (not including feedback paths within individual memory elements) are modified to include at least one scannable storage element, which is both controllable and observable from one or more of the primary pins (input and output). The second feature is that the control inputs for the non-scannable memory elements are held inactive during the scanning process. Both of these features make it possible to treat the sequential circuit as a feedforward design (a design which contains no critical feedback paths) and testing of a feedforward network requires only slightly more difficult testing procedures than those applicable to pure combinational circuits. As with other partial Scan techniques, however, the cost in terms of area overhead of RTS is relatively high and complete fault detection is not possible.

U.S. Pat. No. 5,027,355 to Stoica, entitled *Logic Circuit and Design Method for Improved Testability* and U.S. Pat. No. 5,077,740 to Kanuma, entitled *Logic Circuit Having Normal Input/Output Data Paths Disabled When Test Data Is Transferred During Macrocell Testing* also disclose design for testability techniques. FIG. 5 is a reproduction of FIG. 1 of the Kanuma '740 patent. The '740 patent to Kanuma discloses a logic circuit having independently testable macrocells. In particular, each macrocell comprises a discrete memory circuit 6 (having a plurality of memory elements therein) a discrete combinational logic circuit 7 and a discrete input-output circuit 8. During normal operation, input signals 101 are externally supplied to the logic circuit 1, to the input-output circuit 8 in each macrocell and then to the respective cell's memory circuit 6 via the combinational logic circuit 7. A decoder 5 is provided for selecting the macrocell to be tested, based on a select signal 103. The decoder 5 is designed to provide signal 104-0 for testing the entire circuit 1 and signals 104-(1)-(1) for testing discrete macrocells 2(1)-2(1) independently. As with the other SCAN techniques, however, the Kanuma circuit pays a substantial area and performance penalty caused, in part, by the input-output circuits 8 of each macrocell.

U.S. Pat. No. 5,230,001 to Chandra et al., entitled *Method For Testing A Sequential Circuit by Splicing Test Vectors*

*Into Sequential Test Pattern*, discloses a vector splicing methodology for performing sequential testing of an integrated circuit having embedded test circuitry. In particular, the test circuitry comprises a test point array having a test grid structure of test points. The grid structure is formed of individually accessible probe lines and control/sense lines with electronic switches at the crossings. Again, as with the above-mentioned testability techniques, the Chandra et al. circuit incorporates a significant amount of circuitry dedicated to the performance of fault testing, thereby significantly reducing the circuit effective integration level and adversely effecting the circuit's performance.

One attempt to address the area overhead and performance penalty associated with the above-mentioned testability techniques is described in an article by M. Abramovici, K. Rajan and D. Miller, entitled *FREEZE!: A New Approach for Testing Sequential Circuits*, 29th ACM/IEEE Design Automation Conference, pp. 22–25 (1992). The article discloses that because of the complexity of sequential test generation (STG) schemes, any approach that maintains the classical framework of targeting one fault at a time using an iterative array model for sequential testing can offer only marginal improvements over existing testability techniques. As will be understood by those skilled in the art, classical STG algorithms deal with one target fault at a time, and search for a test sequence to activate the target fault and propagate its effect to a primary output. The search is two-dimensional, as it proceeds both in space (through the circuit) and in time. The article proposes an alternative approach whereby the sequential behavior of the circuit under test is disabled by holding the system clock inactive (i.e., "freezing" the clock) and performing combinational testing of the entire circuit. Combinational testing can be performed using slightly modified CTG algorithms, however, even as modified, these algorithms are not capable of detecting many faults.

Accordingly, notwithstanding the above-mentioned design for testability (DFT) techniques, there continues to be a need for an integrated circuit having only a small percentage of area overhead dedicated to DFT logic. There also continues to be a need for an integrated circuit which is capable of being tested using the more preferable sequential test algorithms, which are capable of detecting more faults, and which can be tested efficiently in terms of both time and cost.

SUMMARY OF THE INVENTION

It is therefore an object of the present invention to provide an integrated circuit having built-in design for test capability.

It is another object of the present invention to provide an integrated circuit which can be tested efficiently using sequential test techniques.

It is a further object of the present invention to provide an integrated circuit having design for test logic which occupies a relatively small percentage of the circuit's total area and which does not require a relatively large number of primary I/O pins.

It is still a further object of the present invention to provide an efficient method for testing an integrated circuit which facilitates the detection of a relatively high percentage of faults.

These and other objects of the invention are provided by an integrated circuit having a plurality of interconnected circuit modules containing interconnected logic and memory elements therein. The modules collectively perform a desired function(s) under synchronous control of a clock and further include built-in design for test capability. Built-in design for test capability is provided by control means for selectively enabling sequential operation of one or more of the modules to be tested and for selectively disabling sequential operation of one or more of the modules not under test.

In particular, the integrated circuit includes sequential/combinational control means, connected to the circuit's modules, for selectively enabling sequential operation of the interconnected memory elements of at least one of the modules, by directing the clock signal to that module(s). The sequential/combinational control means also includes means for selectively disabling sequential operation of at least another of the modules by withholding the clock signal from that module(s).

The sequential/combinational control means preferably comprises a plurality of control cells connected to respective ones of the plurality of modules. The control cells include memory means, such as a shift-register element (latch, flip-flop), for retaining a respective module in a first mode of sequential operation in response to a first data signal (e.g., binary 1) and for retaining the respective module in a second mode of operation, in response to a second data signal (e.g., binary 0). The control cells also include means, connected to the memory means, for transferring the clock signal to the cell's respective module in response to the first data signal and for blocking the clock signal from the respective module in response to the second data signal. The transferring and blocking means preferably comprises a pass-through transistor network connected to the shift register element. As will be understood by those skilled in the art, blocking the clock signal from a module essentially disables sequential operation of the module by preventing a change in the states of the disabled module's memory elements.

A preferred method for testing the integrated circuit of the present invention includes steps for testing one or more of the enabled modules on a module(s) by module(s) basis using, in part, the outputs generated by one or more of the disabled modules, which are electrically connected to the enabled module(s) under test. The method includes steps for disabling the clock signal to at least a first of the modules such that those modules produce one or more output signals, which are functionally dependent on one or more of the respective module's inputs. As will be understood by those skilled in the art, the input lines to one or more of the disabled modules may be directly connected to one or more of the integrated circuit's primary inputs and/or connected to the outputs of another module.

Further included are steps for sequentially testing at least a second module by applying the clock signal and at least some of the output signals generated by the disabled modules to the second module(s). These disabling and enabling steps are then repeated on at least a module by module basis until all the circuit modules have been tested. To further facilitate testing of at least a second module, the output signals generated by at least a first of the modules can be repeatedly modified by a series of enabling and disabling steps to adjust the states of the memory elements of the modules not under test. These steps preferably expand the fault coverage otherwise attainable if one or more of the modules were tested on a strictly independent basis.

Accordingly, sequential/combinational control means is provided for selectively enabling sequential operation of one or more interconnected circuit modules and for selectively disabling sequential operation of the remaining modules. By selectively enabling sequential operation of one or more modules instead of the entire integrated circuit, sequential testing of the circuit can be performed more efficiently on a module(s) by module(s) basis with a high degree of fault coverage. In addition, by controlling testing at the modular level instead of at the lower circuit level as in SCAN and other conventional techniques, the area overhead penalty caused by the presence of DFT logic can be made relatively small.

DESCRIPTION OF PREFERRED EMBODIMENTS

The present invention will now be described more fully hereinafter with reference to the accompanying drawings, in which preferred embodiments of the invention are shown. This invention may, however, be embodied in different forms depending on the particular configuration of the integrated circuit and should not be limited to the embodiments set forth herein. Rather, these embodiments are provided so that this disclosure will be thorough and complete, and will fully convey the scope of the invention to those skilled in the art. Like numbers refer to like elements throughout.

Figure 1:
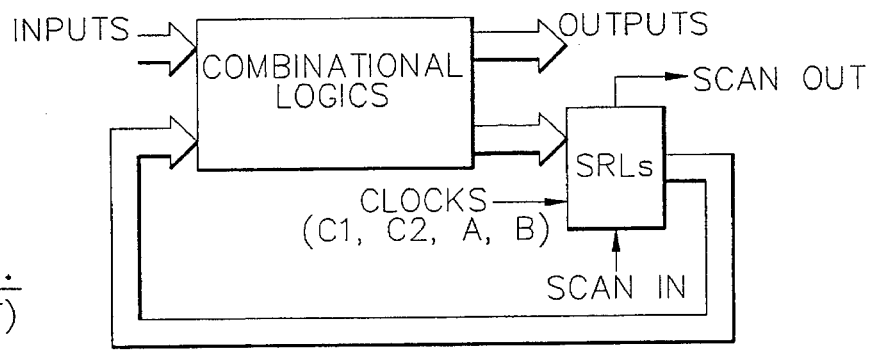
FIG. 1 schematically illustrates a prior art Level Sensitive Scan Design (LSSD) for testability.
Figure 2:
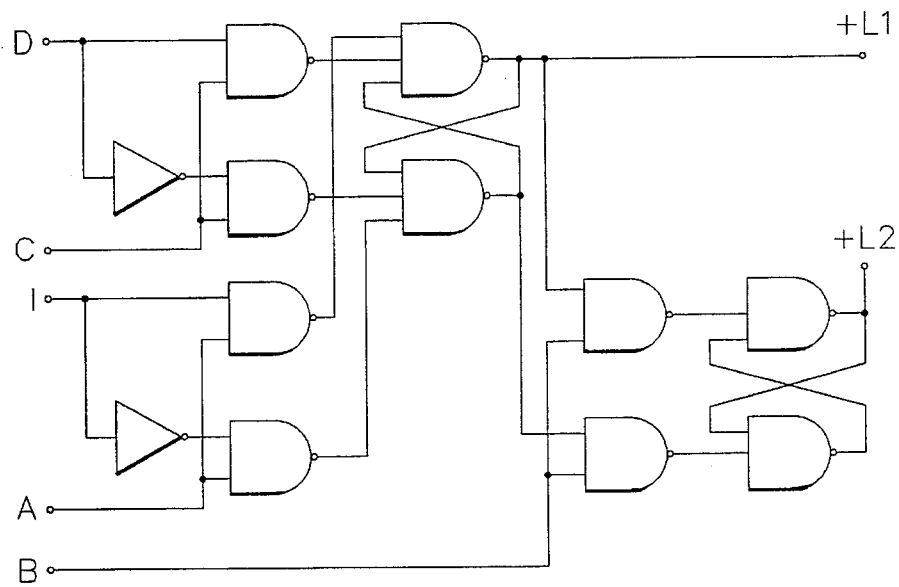
FIG. 2 illustrates an electrical schematic for the shift register latches (SRLs) of FIG. 1.
Figure 3:
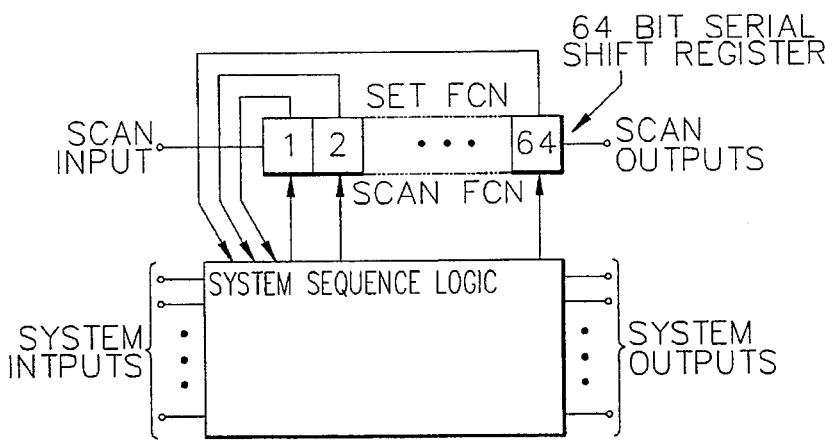
FIG. 3 schematically illustrates a prior art Scan/Set design for testability using a 64 bit shift register.
Figure 4:
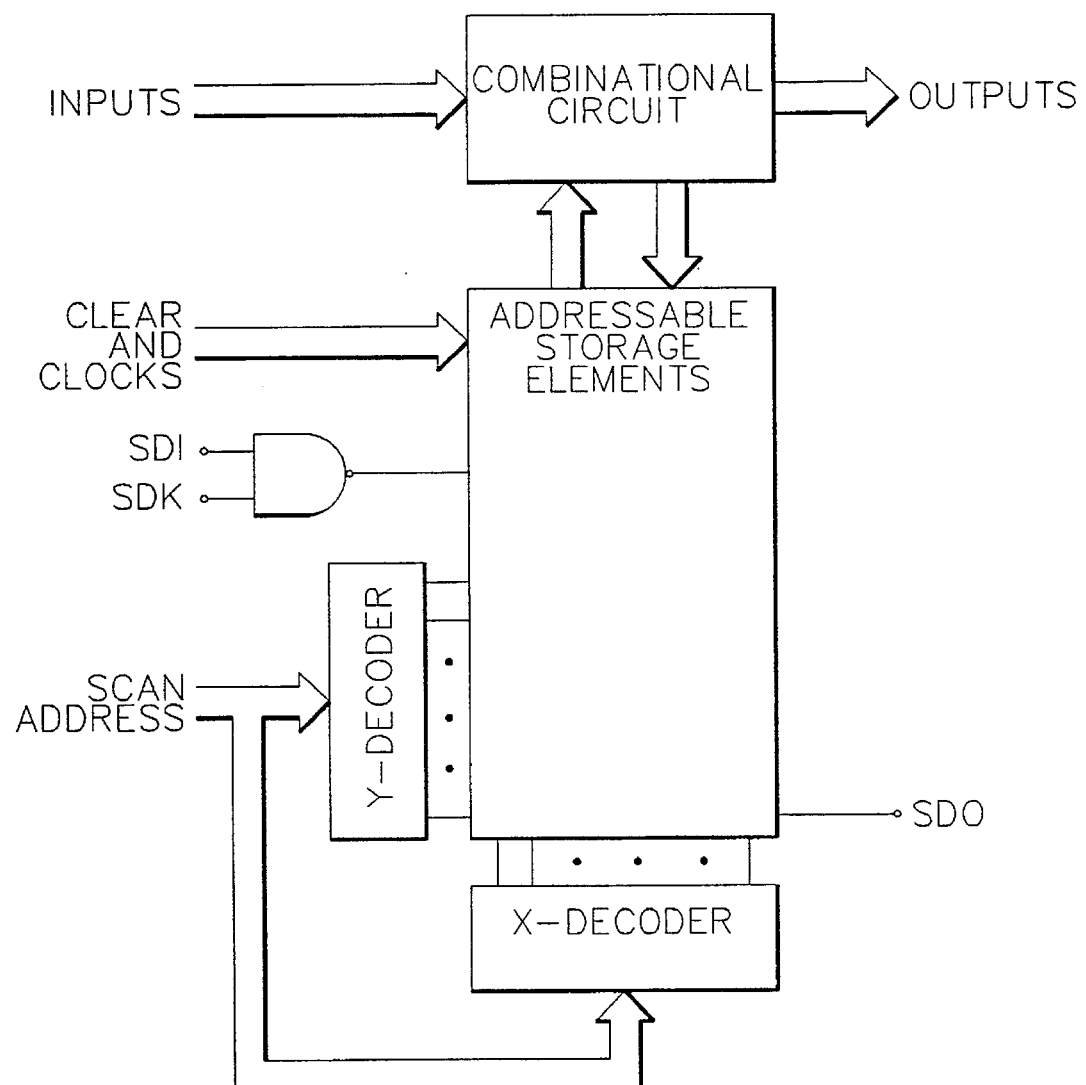
FIG. 4 schematically illustrates a prior art Random-Access Scan (RAS) design for testability.
Figure 5:
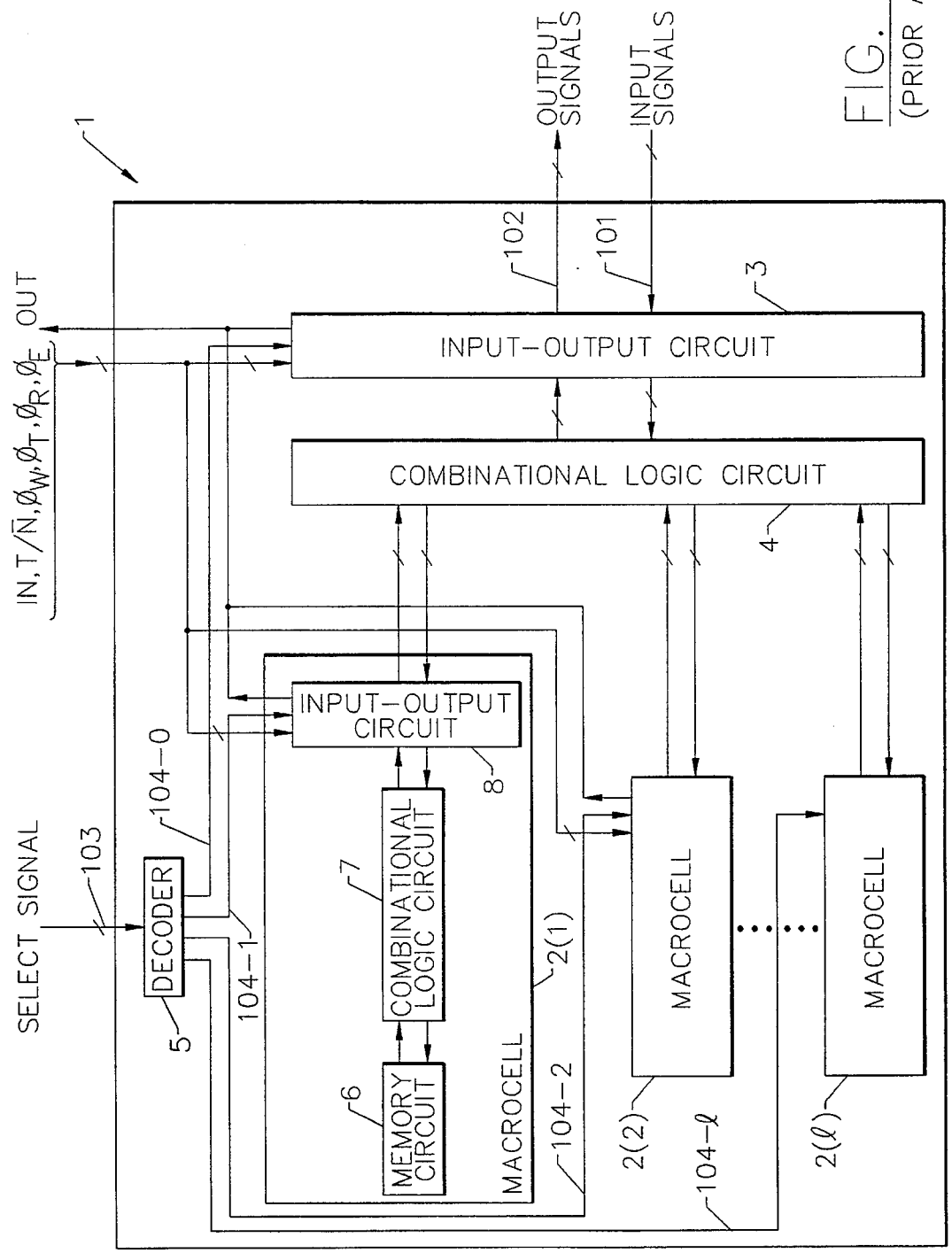
FIG. 5 schematically illustrates a prior art design for testability, according to FIG. 1 of U.S. Pat. No. 5,077,740 to Kanuma.
Figure 6:
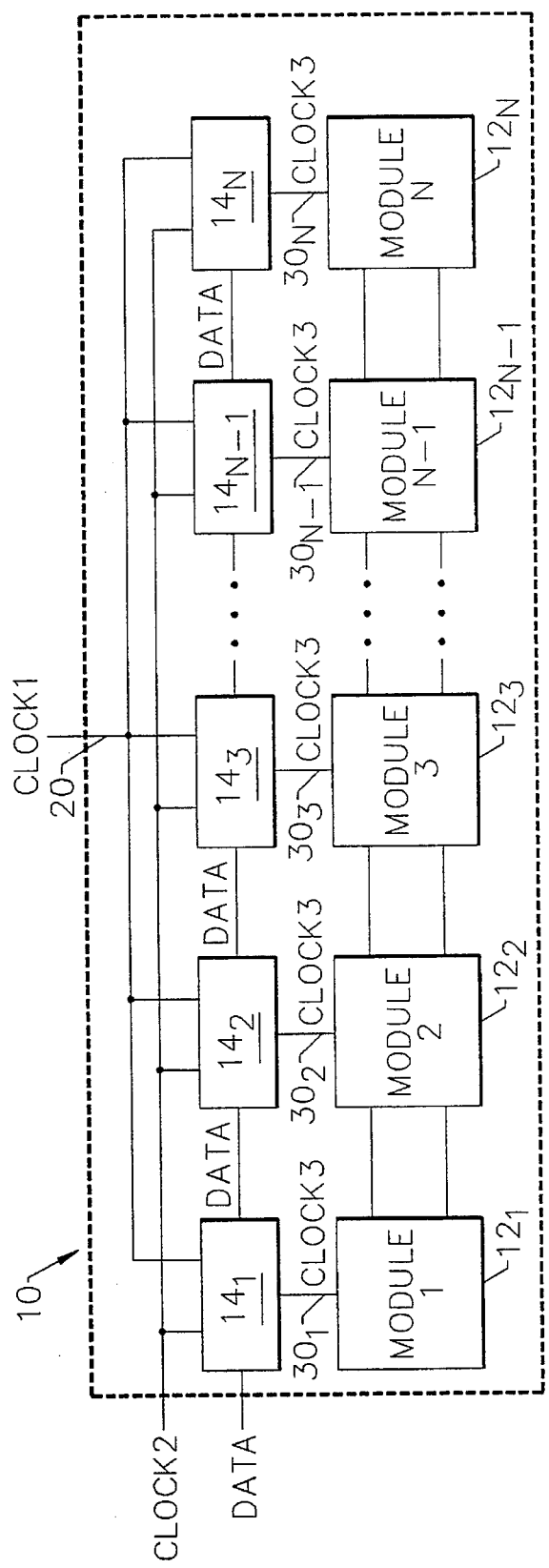
FIG. 6 schematically illustrates an integrated circuit having clock-line control logic, according to a preferred embodiment of the present invention.

Referring now to FIG. 6, an integrated circuit having clock-line control according to the present invention, will be described. The integrated circuit 10 comprises a plurality of interconnected circuit modules $12_1$–$12_N$. The modules may be arranged linearly across the chip as shown, or as a two-dimensional array (not shown). In addition, the modules may be interspersed at other predetermined locations across the chip and may be interconnected in any predetermined manner. These modules collectively perform one or more of the functions of the circuit 10 under synchronous control from an internally generated or externally supplied clock, shown as CLOCK1 20. To facilitate testing of the circuit 10 and the detection of faults, the circuit 10 further includes design for testability (DFT) logic, shown as a plurality of sequential/combinational control cells $14_1$–$14_N$ which are electrically connected to respective modules $12_1$–$12_N$. The control cells $14_1$–$14_N$ enable sequential operation one or more modules by directing the clock signal 20 to respective ones of those modules. However, the control cells disable sequential operation of one or more modules by withholding the clock signal 20 from those modules. As will be understood by those skilled in the art, by providing control cells $14_1$–$14_N$ at the modular level, the area overhead penalty caused by the DFT logic can be made to vary in proportion to the number of modules in the circuit, instead of the total number of memory elements in the circuit which is substantially greater.

Figure 7:
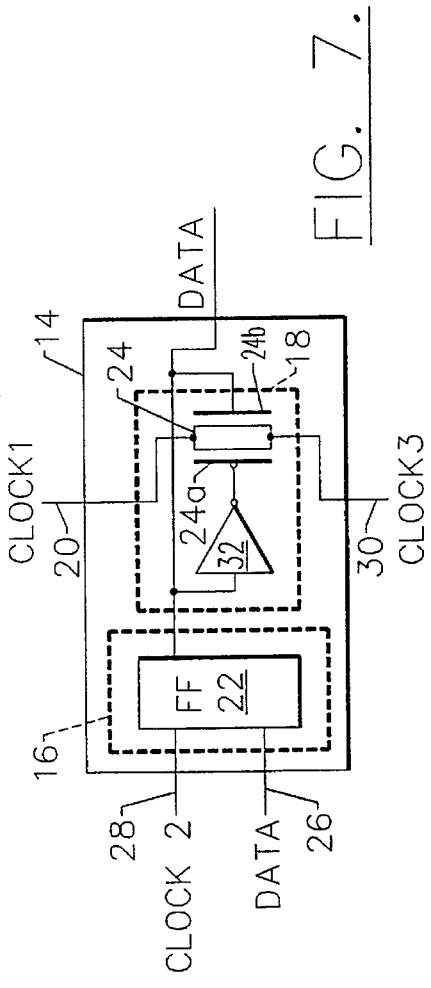
FIG. 7 schematically illustrates clock-line control according to a preferred embodiment of the present invention.

Referring now to FIG. 7, a preferred embodiment of a control cell 14 will be described. In particular, a control cell 14 comprises memory means 16 and means 18, connected to the memory means, for transferring a clock signal 20 (CLOCK1) to a respective module, in response to a first data signal stored in the memory means 16, and for blocking the clock signal 20 from the respective module, in response to a second data signal stored in the memory means 16. The memory means 16 and transferring and blocking means 18 preferably comprise a shift-register element 22, such as a latch or flip-flop (FF), and a dual-gated pass-through transistor network 24, connected as shown. The pass-through transistor network 24 provides a conductive path between CLOCK1 line 20 and CLOCK3 line 30 in response to appropriate biases being applied to gates 24a, 24b. An invertor 32 is also connected between the output of each flip-flop 22 and gate 24a.

As an example, a method for sequentially testing module $12_3$ begins with the step of serially loading the binary string {0,0,1, . . . ,0,0}into the control cells $14_1$–$14_N$, using the DATA line 26 and CLOCK2 line 28, as shown. After the data is loaded, each of the memory elements 22 of control cells $14_1$, $14_2$, $14_{N-1}$ and $14_N$ will contain a first data signal (binary 0). This first data signal Will prevent any clock transitions (0⇋1) on the CLOCK1 line 20 from occurring at the CLOCK3 lines $30_1$, $30_2$, $30_{N-1}$, $30_N$. Essentially, once the test data is loaded into the control cells $14_1$–$14_N$, only CLOCK3 line $30_3$ will undergo transitions in response to the CLOCK1 line 20. Thus, module $12_3$ can be sequentially tested independently of the other modules using data from one or more primary inputs (not shown). However, testing of module $12_3$ is preferably performed using data from the outputs of module $12_2$ and module $12_4$ (not shown) and other adjacent interconnected modules, if any. Disabled modules $12_1$, $12_2$, $12_{N-1}$ and $12_N$ will not undergo sequential testing until their respective control cells are loaded with an appropriate data signal.

As will be understood by those skilled in the art, if a disabled module comprises a Mealy sequential network, it can be used to provide a plurality of combinational output signals and perform a plurality of combinational functions, based on the logic state of the memory elements (e.g., binary 1 or 0) at the time the clock (CLOCK1) is withheld. The ability of a Mealy sequential network to operate asynchronously, by performing one or more combinational functions is well known and is described in a book by C. H. Roth, Jr. entitled *The Fundamentals of Logic Design*, West Publishing Co., 2nd Edition, pp. 281–284, (1979). Essentially, a Mealy sequential network can provide combinational output signals because one or more of its outputs is directly traceable to one or more of its inputs, without encountering a memory element.

Accordingly, Mealy outputs are functionally dependent on Mealy inputs, even when sequential operation of the Mealy network has been terminated by withholding the clock (CLOCK1). The combinational function(s) performed by a disabled Mealy module can also be modified by temporarily reapplying the clock, changing the state of the module's memory elements (e.g., by adjusting the inputs to the disabled module) and then withholding the clock to again lock-in one or more of the disabled module's memory elements in a new state.

The outputs of a disabled module which comprises a Moore sequential network can also be adjusted using this technique. However, a Moore sequential network will not perform a plurality of combinational logic functions because the outputs of a Moore network are only a function of the state of the memory elements therein and not also a function of the network's inputs.

Thus, if the disabled module(s) comprises either a Moore or a Mealy network, the steps of (i) disabling the module by withholding the clock, (ii) temporarily enabling the module by providing the clock and causing a change of state of the module's memory elements and (iii) disabling the module again to latch-in new states, can be useful for sequentially testing the enabled module(s) on a module by module basis, until testing of the entire circuit has been completed.

Figure 8:
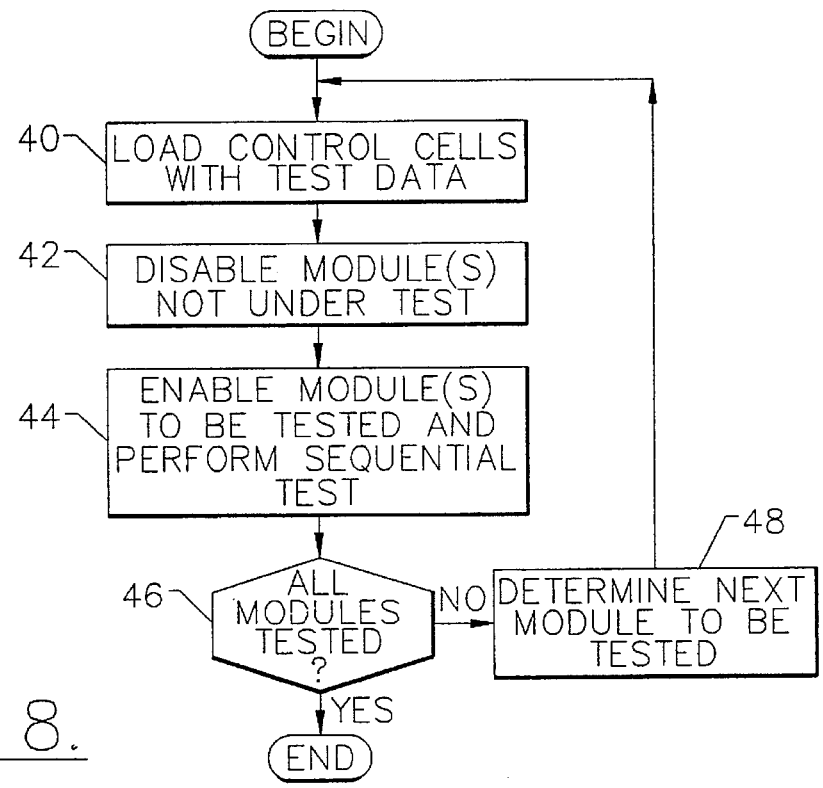
FIG. 8 illustrates steps for sequentially testing an integrated circuit on a module by module basis, according to one embodiment of the present invention.

Referring now to FIG. 8, a preferred method for testing an integrated circuit 10 according to the present invention will be described. The method begins with the step (Block 40) of loading the control cells $14_1$–$14_N$ with test data corresponding to a first group of modules which are to perform sequential operations, and test data corresponding to a second group of modules which are not to perform sequential operations. Those modules which are not to perform sequential operations are then disabled (Block 42). As shown by FIG. 6, one or more modules can be disabled by rendering the pass-through transistor network 24 of the respective control cell 14 nonconductive.

Next, the module or modules to be tested simultaneously are enabled and sequential testing of the enabled modules is then performed (Block 44) using known sequential testing techniques. One such technique is described in an article by T. Niermann and J. Patel, entitled *HITEC: A Test Generation Package For Sequential Circuits*, Proceedings IEEE European Design Automation Conference, pp. 214–218 (1991), the disclosure of which is hereby incorporated herein by reference. Because testing is to be performed at the modular level instead of at the gate level, the total number of states a sequential test generator has to consider at one time is determined by the number of memory elements in the module(s) under test versus the total number of memory elements in the entire circuit which can be substantially greater. At Block 46, a decision is made as to whether all modules have been tested. If yes, testing of the integrated circuit is complete, otherwise, the control cells 14 are loaded with a new binary string (Block 40), corresponding to one or more of the remaining modules to be tested (Block 48).

Figure 9:
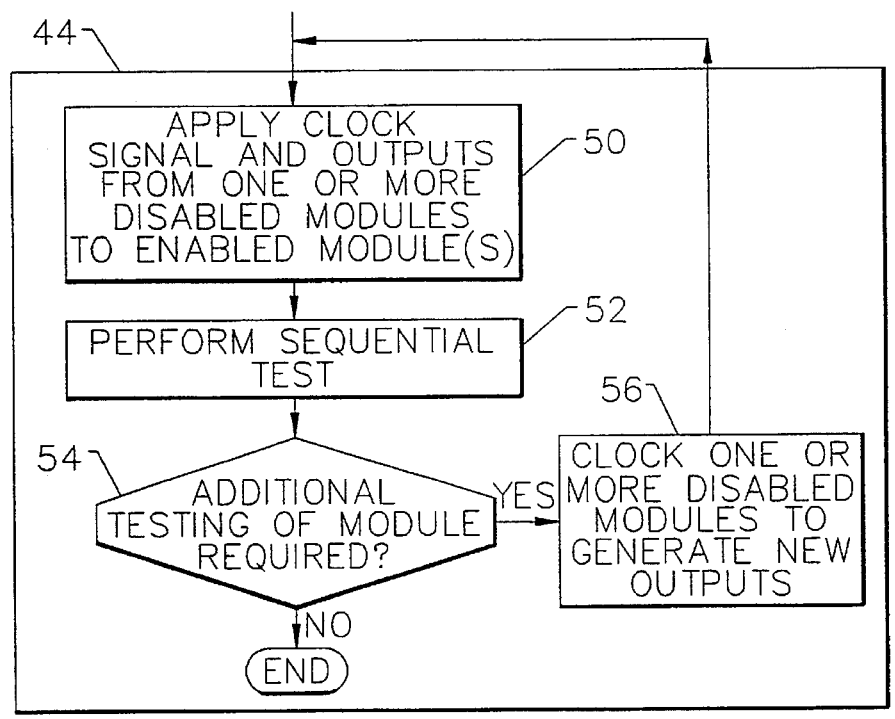
FIG. 9 illustrates the steps for sequentially testing an integrated circuit module(s), according to a second embodiment of the present invention.

The step of performing sequential testing (Block 44) will typically comprise a plurality of steps, as shown by FIG. 9. In particular, sequential testing of one or more enabled modules comprises the steps of providing a clock signal and outputs from one or more of the disabled modules to the enabled module(s) under test (Block 50). Then, sequential testing of the enabled module(s) is performed (Block 52). To increase the degree of fault coverage for a particular module under test, it may be necessary to alter the outputs provided by one or more of the disabled modules during the testing of the enabled modules. Accordingly, a decision (Block 54) is made as to whether one or more of the disabled modules should be adjusted. If adjustment is necessary, one or more of the disabled modules are then forced to undergo a sequential state change to a new state (Block 56). If the disabled module is a Mealy sequential network, a new set of combinational operations may be achieved by adjusting the state of one or more of its memory elements. As will be understood by those skilled in the art, the ability to alter one or more outputs of one or more of the disabled modules, which are connected to an enabled module under test, is analogous to providing the enabled module under test with a greater number of primary input pins for testing. Thus, the above-recited steps provide for greater controllability of the module under test, which is desirable, without actually requiring the presence of additional primary inputs pins, which is undesirable. Testing of the enabled module(s) is then continued (Block 50) until complete.

In the drawings and specification, there have been disclosed typical preferred embodiments of the invention and, although specific terms are employed, they are used in a generic and descriptive sense only and not for the purposes of limitation, the scope of the invention being set forth in the following claims.

That which is claimed:

1. An integrated circuit having built-in design for test capability, comprising:

a plurality of interconnected circuit modules having a plurality of interconnected logic elements and memory elements therein, said modules being responsive to a clock signal for controlling sequential operation of said plurality of interconnected memory elements; and sequential/combinational control means, connected to said modules, for selectively enabling sequential operation of said interconnected memory elements of at least a first of said modules by directing said clock signal to said at least a first of said modules and for selectively disabling sequential operation of said interconnected memory elements of at least a second of said modules by withholding said clock signal from said at least a second of said modules, while allowing combinational operation of said interconnected logic elements of said at least a second of said modules, wherein said sequential/combinational control means comprises memory means for retaining data bits and wherein the logic value of said data bits determines which of said plurality of modules are said at least a first of said modules and which are said at least a second of said modules.

2. An integrated circuit having built-in design for test capability, comprising:

a plurality of interconnected circuit modules having a plurality of interconnected logic elements and memory elements therein, said modules being responsive to a clock signal for controlling sequential operation of said plurality of interconnected memory elements; and sequential/combinational control means, connected to said modules, for selectively enabling sequential operation of said interconnected memory elements of at least a first of said modules by directing said clock signal to said at least a first of said modules and for selectively disabling sequential operation of said interconnected memory elements of at least a second of said modules by withholding said clock signal from said at least a second of said modules, while allowing combinational operation of said interconnected logic elements of said at least a second of said modules, wherein said sequential/combinational control means comprises a plurality of control cells connected to respective ones of said plurality of modules, and wherein each of said plurality of control cells comprises memory means for retaining a respective module in a first mode of sequential operation in response to a first data signal and for retaining said respective module in a second mode of combinational operation in response to a second data signal.

3. The integrated circuit of claim 2, wherein said memory means is responsive to a second clock signal and comprises a shift-register element for retaining one of said first and said second data signals.

4. The integrated circuit of claim 2, wherein each of said plurality of control cells further comprises means, connected to said memory means, for transferring said clock signal to said respective module in response to said first data signal stored in said memory means and for blocking said clock signal from said respective module in response to said second data signal stored in said memory means.

5. The integrated circuit of claim 3, wherein each of said plurality of control cells further comprises means, connected to said memory means, for transferring said clock signal to said respective module in response to said first data signal stored in said memory means and for blocking said clock signal from said respective module in response to said second data signal stored in said memory means.

6. The integrated circuit of claim 5, wherein said transferring and blocking means comprises a pass-through transistor network connected to said shift-register element.

7. An integrated circuit having built-in design for test capability, comprising:

a plurality of interconnected logic elements;

a plurality of interconnected memory elements interspersed among said interconnected logic elements, said memory elements being responsive to a clock signal for controlling sequential operation of said memory elements; and sequential/combinational control means, connected to said interconnected memory elements, for enabling sequential operation of a first group of said interconnected memory elements by directing said clock signal to said first group and for selectively disabling sequential operation of a second group of said interconnected memory elements, different from said first group, by withholding said clock signal from said second group, while allowing combinational operation of said interconnected logic elements, wherein said sequential/combinational control means comprises a control cell, connected to said first group, having a memory element for retaining said first group in a first mode of sequential operation in response to a first data signal and for retaining said first group in a second mode of combinational operation in response to a second data signal.

8. The integrated circuit of claim 7, further comprising a plurality of said control cells respectively connected to said second group and to third and fourth distinct groups of said interconnected memory elements, and wherein the memory elements for said first, second, third and fourth cells are serially connected to form a shift-register responsive to a second clock signal.

9. The integrated circuit of claim 8, wherein said control cells further comprise means, connected to respective groups of said interconnected memory elements, for transferring said clock signal to said respective group in response to said first data signal stored in said respective memory element and for blocking said clock signal from said respective group in response to said second data signal stored in said respective memory element.

10. The integrated circuit of claim 9, wherein said transferring and blocking means for each of said control cells comprise pass-through transistor networks connected to respective groups of said interconnected memory elements.

11. An integrated circuit having built-in design for test capability, comprising:

a plurality of interconnected circuit modules having a plurality of interspersed and interconnected logic elements and memory elements therein, said modules being responsive to a clock signal for controlling sequential operation of said plurality of interconnected memory elements; and sequential/combinational control means, connected to said modules, for selectively enabling sequential operation of at least a first of said modules by directing said clock signal to said at least a first of said modules and for selectively disabling sequential operation of at least a second of said modules by withholding said clock signal from said memory elements of said at least a second of said modules, while allowing combinational operation of said logic elements of said at least a second of said modules, wherein the combinational function performed by said at least a second of said modules is dependent on the state of the memory elements of said at least a second of said modules, wherein said sequential/combinational control means comprises memory means for retaining data bits and wherein the logic value of said data bits determines which of said plurality of modules are said at least a first of said modules and which are said at least a second of said modules, and wherein one of said at least a second of said modules comprises a Mealy sequential network.

12. An integrated circuit having built-in design for test capability, comprising:

a plurality of interconnected circuit modules having a plurality of interspersed and interconnected logic elements and memory elements therein, said modules being responsive to a clock signal for controlling sequential operation of said plurality of interconnected memory elements; and sequential/combinational control means, connected to said modules, for selectively enabling sequential operation of at least a first of said modules by directing said clock signal to said at least a first of said modules and for selectively disabling sequential operation of at least a second of said modules by withholding said clock signal from said memory elements of said at least a second of said modules, while allowing combinational operation of said logic elements of said at least a second of said modules, and wherein the combinational function performed by said at least a second of said modules is dependent on the state of the memory elements of said at least a second of said modules, wherein said sequential/combinational control means comprises a plurality of control cells connected to respective ones of said plurality of modules, and wherein each of said plurality of control cells comprises memory means for retaining a respective module in a first mode of sequential operation in response to a first data signal and for retaining said respective module in a second mode of combinational operation in response to a second data signal.

13. The integrated circuit of claim 12, wherein each of said plurality of control cells further comprises means, connected to said memory means, for transferring said clock signal to said respective module in response to said first data signal stored in said memory means and for blocking said clock signal from said respective module in response to said second data signal stored in said memory means.

14. The integrated circuit of claim 13, wherein said memory means is responsive to a second clock signal and comprises a shift-register element for retaining one of said first and said second data signals.

15. The integrated circuit of claim 14, wherein each of said plurality of control cells further comprises means, connected to said memory means, for transferring said clock signal to said respective module in response to said first data signal stored in said memory means and for blocking said clock signal from said respective module in response to said second data signal stored in said memory means.

16. The integrated circuit of claim 15, wherein said transferring and blocking means comprises a pass-through transistor network connected to said shift-register element.

17. A method of testing an integrated circuit having a plurality of modules, containing interconnected logic and memory elements therein, which are responsive to a first clock signal for performing sequential operations, and a plurality of control cells each connected to a respective one of said plurality of modules, comprising the steps of:

loading said plurality of control cells with a string of data bits having binary logic values;

disabling said first clock signal to at least a first of said modules such that said at least a first of said modules operates combinationally and produces a first set of combinational output signals;

sequentially testing at least a second module by applying said first clock signal and at least some of said first set of combinational output signals to said at least a second module; and repeating said disabling and sequential testing steps for remaining ones of said plurality of modules to test said integrated circuit, wherein the logic values of said data bits determine which of said plurality of modules are said at least a first of said modules and which are said at least a second module.

18. The method of claim 17 wherein said disabling step comprises the step of disabling said first clock signal to all of said modules except to said at least a second module.

19. A method of testing an integrated circuit having a plurality of modules, containing interconnected logic and memory elements therein, which are responsive to a first clock signal for performing sequential operations, comprising the steps of:

disabling said first clock signal to at least a first of said modules such that said at least a first of said modules operates combinationally and produces a first set of combinational output signals;

sequentially testing at least a second module by applying said first clock signal and at least some of said first set of combinational output signals to said at least a second module; and repeating said disabling and sequential testing steps for remaining ones of said plurality of modules to test said integrated circuit, wherein said sequentially testing step comprises the steps of:

applying said first clock signal and at least some of said first set of combinational output signals to said at least a second module;

applying a second clock signal to said at least a first of said modules such that said at least a first of said modules operates sequentially;

disabling said second clock signal to said at least a first of said modules such that said at least a first of said modules operates combinationally and produces a second set of combinational output signals; and applying said first clock signal and at least some of said second set of combinational output signals to said at least a second module.

20. The method of claim 19 wherein said first clock signal equals said second clock signal.

21. A method of testing an integrated circuit having a plurality of modules, containing interconnected logic and memory elements therein, which are responsive to a first clock signal for performing sequential operations, comprising the steps of:

disabling said first clock signal to at least a first of said modules such that said at least a first of said modules operates combinationally and produces a first set of combinational output signals;

sequentially testing at least a second module by applying said first clock signal and at least some of said first set of combinational output signals to said at least a second module; and repeating said disabling and sequential testing steps for remaining ones of said plurality of modules to test said integrated circuit;

wherein said disabling step comprises the steps of:

disabling said first clock signal to one of at least a first of said modules such that said one operates combinationally and produces a first subset of combinational output signals;

disabling said first clock signal to another of at least a first of said modules such that said another operates combinationally and produces a second subset of combinational output signals; and wherein said sequentially testing step comprises the steps of:

applying said first clock signal, at least some of said first subset of combinational output signals and at least some of said second subset of combinational output signals to said at least a second module;

applying a second clock signal to said one of at least a first of said modules such that said one of at least a first of said modules operates sequentially;

applying said second clock signal to said another of at least a first of said modules such that said another of at least a first of said modules operates sequentially;

disabling said second clock signal to said one of at least a first of said modules such that said one of at least a first of said modules operates combinationally and produces a third subset of combinational output signals;

disabling said second clock signal to said another of at least a first of said modules such that said another of at least a first of said modules operates combinationally and produces a fourth subset of combinational output signals; and applying said first clock signal, at least some of said third subset of combinational output signals and at least some of said fourth subset of combinational output signals to said at least a second module.

22. The method of claim 21 wherein said first clock signal disabling steps are performed simultaneously and wherein said second clock signal disabling steps are performed simultaneously.

23. The method of claim 21 wherein said first clock signal equals said second clock signal.

24. A method for testing an integrated circuit including logic elements, memory elements and a plurality of interconnected circuit modules having interconnected memory elements and logic elements therein, comprising the steps of:

loading a first group of said memory elements with data corresponding to a first group of said circuit modules which are to perform sequential operations;

loading a second group of said memory elements, different from said first group, with data corresponding to a second group of said circuit modules which are not to perform sequential operations;

providing a first clock signal to said integrated circuit;

disabling said first clock signal to said second group of said circuit modules, based on said data contained in said second group of said memory elements, so that said second group of said circuit modules produce a first set of output signals; and applying said first clock signal and at least some of said first set of output signals to said first group of said circuit modules, based on said data contained in said first group of said memory elements, so that said first group of said circuit modules produce first sequential output signals.

25. The method of claim 24, further comprising the steps of:

loading a third group of said memory elements with data corresponding to a third group of said circuit modules which are to perform sequential operations;

loading a fourth group of said memory elements, different from said third group, with data corresponding to a fourth group of said circuit modules which are not to perform sequential operations;

disabling said first clock signal to said fourth group of said circuit modules, based on said data contained in said fourth group of said memory elements, so that said fourth group of said circuit modules produce a third set of output signals; and applying said first clock signal and at least some of said third set of output signals to said third group of said circuit modules, based on said data contained in said third group of said memory elements, so that said third group of said circuit modules produce third sequential output signals.

26. The method of claim 25 wherein some of said second group of said circuit modules equal some of said fourth group of said circuit modules.

27. The method of claim 26 further comprising the step of providing a second clock signal to said integrated circuit and wherein said first clock signal applying step is followed by the steps of:

applying a second clock signal to at least one of said second group of said circuit modules so that said second group of circuit modules produces a second set of output signals; and applying said first clock signal and at least some of said second set of output signals to said first group of said circuit modules so that said first group of said circuit modules produce second sequential output signals.

28. The method of claim 27, wherein said first clock signal equals said second clock signal.

29. The method of claim 27, further comprising the steps of:

loading a third group of said memory elements with data corresponding to a third group of said circuit modules which are to perform sequential operations;

loading a fourth group of said memory elements, different from said third group, with data corresponding to a fourth group of said circuit modules which are not to perform sequential operations;

disabling said first clock signal to said fourth group of said circuit modules, based on said data contained in said fourth group of said memory elements, so that said fourth group of said circuit modules produce a third set of output signals; and applying said first clock signal and at least some of said third set of output signals to said third group of said circuit modules, based on said data contained in said third group of said memory elements, so that said third group of said circuit modules produce third sequential output signals.

30. A method of testing an integrated circuit having a plurality of modules, containing interconnected logic and memory elements therein, which are responsive to a clock signal for performing sequential operations, and a plurality of control cells each connected to a respective one of said plurality of modules, comprising the steps of:

loading said plurality of control cells with a string of data bits having binary logic values;

disabling said clock signal to at least a first of said modules such that said at least a first of said modules produces a first set of output signals;

sequentially testing at least a second module by applying said clock signal and at least some of said first set of output signals to said at least a second module; and repeating said disabling and sequential testing steps for remaining ones of said plurality of modules to test said integrated circuit, wherein the logic values of said data bits determine which of said plurality of modules are said at least a first of said modules and which are said at least a second module.

31. The method of claim 30 wherein said disabling step comprises the step of disabling said clock signal to all of said modules except to said at least a second module.

32. A method of testing an integrated circuit having a plurality of modules, containing interconnected logic and memory elements therein, which are responsive to a clock signal for performing sequential operations, comprising the steps of:

disabling said clock signal to at least a first of said modules such that said at least a first of said modules produces a first set of output signals;

sequentially testing at least a second module by applying said clock signal and at least some of said first set of output signals to said at least a second module; and repeating said disabling and sequential testing steps for remaining ones of said plurality of modules to test said integrated circuit, wherein said sequentially testing step comprises the steps of:

applying said clock signal and at least some of said first set of output signals to said at least a second module;

applying said clock signal to said at least a first of said modules such that said at least a first of said modules operates sequentially;

disabling said clock signal to said at least a first of said modules such that said at least a first of said modules produces a second set of output signals; and applying said clock signal and at least some of said second set of output signals to said at least a second module.

33. A method of testing an integrated circuit having a plurality of modules, containing interconnected logic and memory elements therein, which are responsive to a clock signal for performing sequential operations, comprising the steps of:

disabling said clock signal to at least a first of said modules such that said at least a first of said modules produces a first set of output signals;

sequentially testing at least a second module by applying said clock signal and at least some of said first set of output signals to said at least a second module; and repeating said disabling and sequential testing steps for remaining ones of said plurality of modules to test said integrated circuit, wherein said disabling step comprises the steps of:

disabling said clock signal to one of at least a first of said modules such that said one produces a first subset of output signals;

disabling said clock signal to another of at least a first of said modules such that said another produces a second subset of output signals; and wherein said sequentially testing step comprises the steps of:

applying said clock signal, at least some of said first subset of output signals and at least some of said second subset of output signals to said at least a second module;

applying said clock signal to said one of at least a first of said modules such that said one of at least a first of said modules operates sequentially;

applying said clock signal to said another of at least a first of said modules such that said another of at least a first of said modules operates sequentially;

disabling said clock signal to said one of at least a first of said modules such that said one of at least a first of said modules produces a third subset of output signals;

disabling said clock signal to said another of at least a first of said modules such that said another of at least a first of said modules produces a fourth subset of output signals; and applying said clock signal, at least some of said third subset of output signals and at least some of said fourth subset of output signals to said at least a second module.

* * * * *